United States Patent
Thiruvengadam et al.

(10) Patent No.: US 10,910,081 B2
(45) Date of Patent: Feb. 2, 2021

(54) MANAGEMENT OF TEST RESOURCES TO PERFORM RELIABILITY TESTING OF MEMORY COMPONENTS

(71) Applicant: Micron Technology, Inc., Boise, ID (US)

(72) Inventors: Aswin Thiruvengadam, Folsom, CA (US); Sivagnanam Parthasarathy, Carlsbad, CA (US); Daniel Scobee, Ione, CA (US); Frederick Jensen, El Dorado Hills, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 115 days.

(21) Appl. No.: 16/222,204

(22) Filed: Dec. 17, 2018

(65) Prior Publication Data

US 2020/0194091 A1 Jun. 18, 2020

(51) Int. Cl.
| | |
|---|---|
| *G11C 29/38* | (2006.01) |
| *G11C 29/36* | (2006.01) |
| *G06F 12/16* | (2006.01) |
| *G06F 3/06* | (2006.01) |
| *G06F 11/10* | (2006.01) |
| *G06F 11/16* | (2006.01) |

(52) U.S. Cl.
CPC ............ *G11C 29/38* (2013.01); *G06F 3/0679* (2013.01); *G06F 3/0688* (2013.01); *G06F 11/1016* (2013.01); *G06F 11/167* (2013.01); *G06F 12/16* (2013.01); *G11C 29/36* (2013.01)

(58) Field of Classification Search
CPC ....... G11C 29/38; G11C 29/36; G06F 3/0679; G06F 3/0688; G06F 11/167; G06F 12/16
USPC ...... 714/719, 718, 721, 723, 6.1, 25, 42, 54; 365/200, 201
See application file for complete search history.

(56) References Cited

U.S. PATENT DOCUMENTS

| | | | | |
|---|---|---|---|---|
| 6,160,744 A | * | 12/2000 | Kajigaya | H01L 24/48 365/200 |
| 6,212,089 B1 | * | 4/2001 | Kajigaya | G11O 5/025 257/E23.02 |
| 6,449,741 B1 | * | 9/2002 | Organ | G01R 1/025 714/46 |
| 6,643,180 B2 | * | 11/2003 | Ikehashi | G11O 29/006 365/185.09 |

(Continued)

FOREIGN PATENT DOCUMENTS

KR 1020140141648 A 12/2014

OTHER PUBLICATIONS

PCT Notification of Transmittal of the International Search Report and the Written Opinion of the International Searching Authority for PCT Application No. PCT/US2019/066653, dated Apr. 14, 2020, 13 pages.

*Primary Examiner* — John J Tabone, Jr.
(74) *Attorney, Agent, or Firm* — Lowenstein Sandler LLP

(57) ABSTRACT

Filter information associated with a test to be performed with one or more memory components is determined. A set of memory components matching the filter information may be reserved for use in the testing. Test execution information defining a set of test processes of the test is determined. A connection with a first test process may be established and used to receive feedback information associated with execution of the test process. Based on the feedback information, a failure of the first test process may be identified.

20 Claims, 9 Drawing Sheets

(56) References Cited

U.S. PATENT DOCUMENTS

| | | | | |
|---|---|---|---|---|
| 6,967,881 | B2* | 11/2005 | Sasaki | G11O 29/02 |
| | | | | 257/E27.103 |
| 7,092,837 | B1* | 8/2006 | Lanier | G01R 31/31903 |
| | | | | 702/110 |
| 7,532,511 | B2* | 5/2009 | Conley | G06F 12/0246 |
| | | | | 365/185.09 |
| 9,251,915 | B2* | 2/2016 | Lai | G11C 29/08 |
| 10,599,767 | B1* | 3/2020 | Mattera | G06F 40/253 |
| 2006/0146622 | A1* | 7/2006 | Mukherjee | G11O 29/1201 |
| | | | | 365/201 |
| 2007/0269911 | A1* | 11/2007 | Co | G01R 31/31851 |
| | | | | 438/17 |
| 2008/0270057 | A1* | 10/2008 | Balchiunas | B07O 5/344 |
| | | | | 702/82 |
| 2011/0271141 | A1 | 11/2011 | Kursun et al. | |
| 2014/0136915 | A1* | 5/2014 | Hyde | G06F 11/0703 |
| | | | | 714/747 |
| 2014/0229666 | A1* | 8/2014 | Schoenborn | G11O 29/06 |
| | | | | 711/105 |
| 2015/0135026 | A1* | 5/2015 | Lai | G11C 29/56008 |
| | | | | 714/718 |
| 2015/0287476 | A1* | 10/2015 | Park | G11O 29/028 |
| | | | | 714/723 |
| 2017/0024139 | A1* | 1/2017 | Shim | G06F 3/0656 |
| 2019/0266076 | A1* | 8/2019 | Maliani | G06F 11/3692 |
| 2020/0174064 | A1* | 6/2020 | Thiruvengadam | G01R 31/003 |

* cited by examiner

MANAGEMENT OF TEST RESOURCES TO PERFORM RELIABILITY TESTING OF MEMORY COMPONENTS

TECHNICAL FIELD

The present disclosure generally relates to a memory sub-system, and more specifically, relates to testing of memory components for memory sub-systems.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
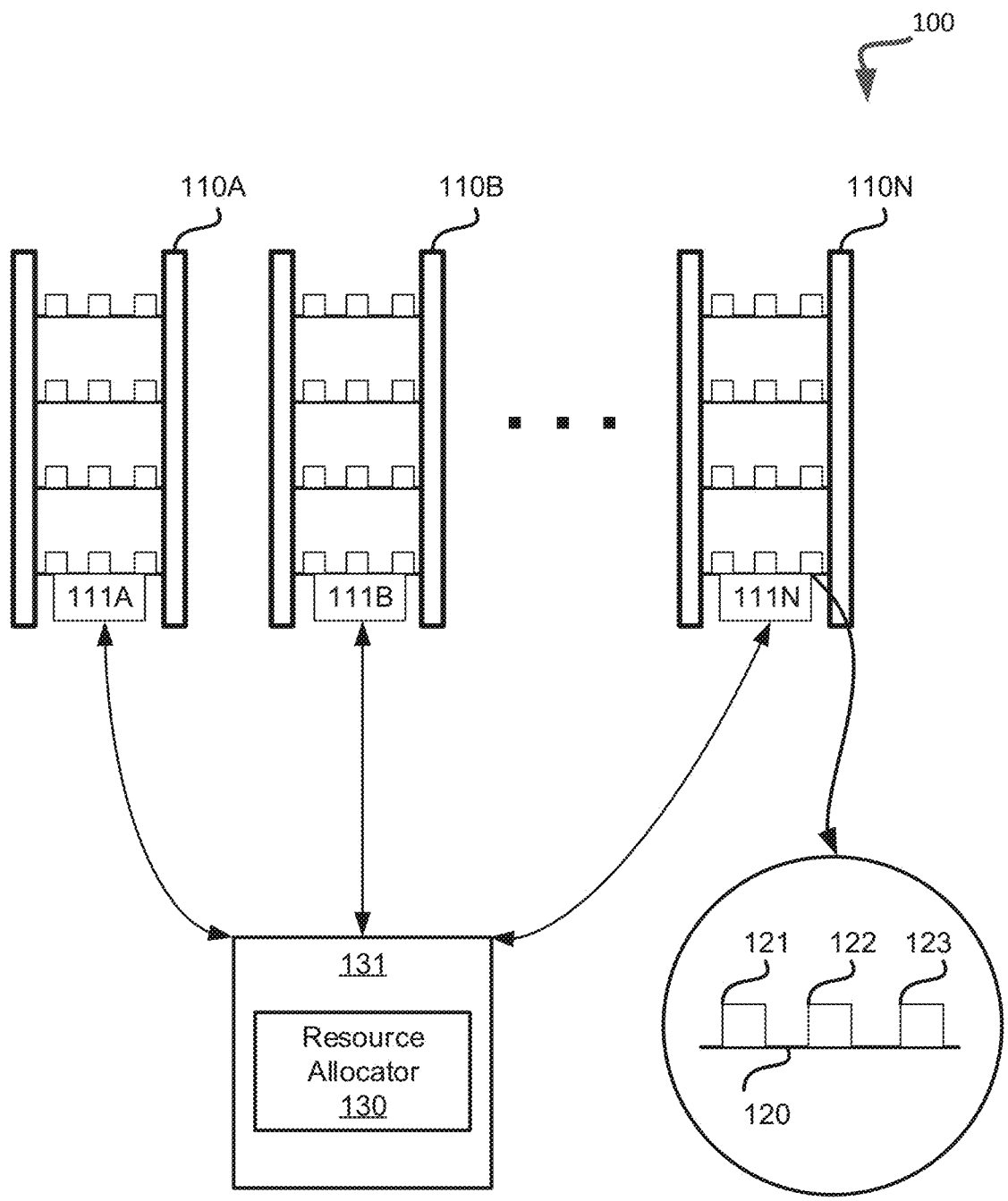
FIG. 1 illustrates an example environment to allocate test resources to perform a test of memory components in accordance with some embodiments of the present disclosure.

Aspects of the present disclosure are directed to multi-dimensional usage space testing of memory components. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

The memory components that are used in a memory sub-system can be tested before being utilized in the memory sub-system. In a conventional test process, the memory components can be placed into a chamber (i.e., an oven) that tests the memory components under various conditions (e.g., temperature conditions). For example, a single chamber can be used to test multiple memory components at a single time at a particular temperature. The test process can instruct various operations to be performed at the memory components at the particular temperature. Such operations can include, but are not limited to, read operations, write operations, erase operations, rapid raw bit error rate measurements, conditional threshold voltage (Vt) distribution collection, thermal loop control, asynchronous power loss control, Open NAND Flash Interface (ONFI) testing, etc. The performance and behavior of the memory components can be observed while the test process is performed. For example, performance characteristics (e.g., read or write latencies) and reliability of data stored at the memory components can be measured and recorded during the test process. However, since the chamber can only apply a limited set of test conditions (e.g., a single temperature) to the memory components at any particular time, the testing of the memory components at many different test conditions (e.g., different temperatures) requires a large amount of time as the test process will need to be performed for each of the one or more desired test conditions. Additionally, the chamber can only perform a single test process at a time. As such, performing multiple different tests of the memory components at different operating conditions (e.g., different temperatures) can utilize a large amount of time if many different conditions of the test process for the memory components are desired.

Aspects of the present disclosure address the above and other deficiencies by allocating test components to perform a test process. A distributed test platform can include multiple test resources. Each test component (e.g., a test resource) can be a test socket that includes a memory component. A test socket can further include a temperature control component that is used to apply a particular temperature condition to the memory component that is included in the test socket. The test platform can further include multiple test boards that each includes one or more of the test sockets to enable the execution of a test under a variety of conditions using multiple geographically dispersed test resource locations. The test boards can be organized into groups or racks and multiple racks can be at a particular location or site. As such, multiple sites can include racks of test boards that include multiple test components (e.g., test sockets and memory components). The racks of the test platform can be coupled over a network to a centralized resource allocator (e.g., one or more servers or other such computing devices) that is used to control, manage, and facilitate the performance of tests at the various test components of the test platform across the different test boards, test racks, and sites or locations.

The test components or test resources of the test platform can be used to perform multiple different test processes at the same time on the test platform. For example, a first subset of the test sockets can be used to perform a first test while a second subset of the test sockets of the test platform can be used to concurrently perform a second test. As such, the resource allocator can allocate or assign the test sockets to be used in a new test of memory components in view of filter information. In some embodiments, the filter information can include one or more elements of characteristics information and usage information. Example characteristics information can include one or more of a product type, probe revision, class revision, version information (i.e., designs or manufacturing revisions) of the memory components, etc. Example usage information associated with the desired test components can include a minimum block cycle count, a maximum block cycle count, a number or range of desired blocks, etc.

The new test can specify particular characteristics or types of memory components that are to be used in the test as well as a particular temperature that the temperature control components are to apply to memory components at the test sockets. Such characteristics can include, but are not limited to, types (e.g., design version) of memory components and usage characteristics of memory components. The resource allocator can then assign available test sockets of the test platform to the new test based on the characteristics specified by the new test as well as additional information of the test platform. For example, the available test sockets can further be assigned based on locations of the test sockets across various test racks or sites of the test platform and the temperature control components can be used to apply the temperatures specified by the test. Thus, the test platform can be a distributed set of test sockets across different locations or sites. Different groups of test sockets of the test platform can be assigned to different tests based on particular characteristics of test sockets specified by the different tests. In some embodiments, the test components or test resources of the test platform can be used to perform the same test processes at the same time under different testing conditions.

In an embodiment, the one or more test processes can identify one or more failures including a failure in the operation of a memory component (e.g., an issue with the operation of the memory component), a failure in the operation of a memory component that causes a corresponding software layer to respond to the occurrence of the failure (e.g., throw an exception), a failure (e.g., an exception) generated by the test program due to the operation of a memory component, or a software, hardware, or firmware bug or error in the test process itself.

Advantages of the present disclosure include, but are not limited to, a decrease in the amount of time that the test platform is utilized to perform tests of the memory components. Furthermore, many different tests can be performed at multiple distributed testing resources to test many different conditions (e.g., different temperatures). In addition, many different sequences of operations can be performed using the distributed system to enable more robust testing and improved reliability and performance of the memory components. As such, since many different tests of the memory components can be performed more quickly, the reliability of the memory components can also be increased as any potential defects or flaws can be identified and later addressed in the design or manufacturing of the memory components that are to be included in a memory sub-system.

FIG. 1 illustrates an example environment to allocate test resources to perform a test of memory components in accordance with some embodiments of the present disclosure. A test resource 100 can include one or more racks 110A, 110B, and 110N. Each of the racks 110A, 110B, and 110N can include multiple test boards 120 where each test board 120 includes one or more test sockets (i.e., test resources). The test resource 100 can include any number of racks or test sockets.

As shown, a test board 120 can include one or more test sockets. For example, a test board 120 can include a first test socket 121, a second test socket 122, and a third test socket 123. Although three test sockets are shown, a test board 120 can include any number of test sockets. Each test socket can include a memory component that has been embedded within the respective test socket. Additionally, each test socket can include a temperature control component that is used to apply a temperature condition to the embedded memory component. In some embodiments, the temperature control component can be a dual Peltier device (e.g., two Peltier devices) that utilize a Peltier effect to apply a heating or cooling effect at a surface of the dual Peltier device that is coupled to the embedded memory component. In the same or alternative embodiments, the temperature control component can be placed on top of the memory component in the respective test socket.

As shown, each test rack 110A, 110B, and 110N can include multiple test boards 120. Each of the test boards 120 of a particular test rack can be coupled with a local test component. For example, each test rack 110A, 110B, and 110N can respectively include a local test component 111A, 111B, and 111N. Each of the local test components 111A, 111B, and 111N can receive instructions to perform a test or a portion of a test that is to be performed at the test sockets of the respective test rack. For example, a resource allocator component 130 can receive (e.g., from a user) conditions of the test that is to be performed and the resource allocator component 130 can determine particular test sockets across the different test boards 120 at one or more of the test racks 110A, 110B, and 110N that can be used by the test. In some embodiments, the resource allocator component 130 can be provided by a server 131. In some embodiments, the server 131 is a computing device or system that is coupled with the local test components 111A, 111B, and 111N over a network.

The temperate control component of each test socket 121, 122, and 123 of each test board 120 can be used to apply a different temperature condition to the respective embedded memory component. Furthermore, each test socket 121, 122, and 123 can be used to perform different operations at the embedded memory component.

The resource allocator component 130 can receive a test input from a user. In some embodiments, the test input (or test request) can be received from the user via an interface, such as example interface 300 shown in FIG. 3. The test input can specify conditions of the test (also referred to as "test conditions") that is to be performed with one or more memory components. For example, the test can specify particular temperature conditions that are to be applied to memory components and a sequence of operations that are to be performed at memory components under particular conditions. The resource allocator 130 can retrieve a data structure that identifies available test sockets across the test platform 100 as well as characteristics of the available test sockets. Subsequently, the resource allocator component 130 can assign test sockets at the test platform 100 that include embedded memory components that match or satisfy the conditions of the test. In some embodiments, the resource allocator component 130 can identify the test sockets matching the test conditions by analyzing characteristics information and usage information associated with the available test sockets. In an embodiment, characteristics information about each test socket of a rack (e.g., rack 110A, 110B, 110N of FIG. 1) can be stored in one or more databases (referred to as a "characteristic database"). In an embodiment, usage information about each test socket of a rack can be stored in one or more databases (referred to as a "usage database"). The resource allocator component 130 can then transmit instructions to local test components of test racks that include test sockets that are identified for use in the test based on the associated characteristic and usage information. Further details with respect to the resource allocator component 130 are described below.

Figure 2:
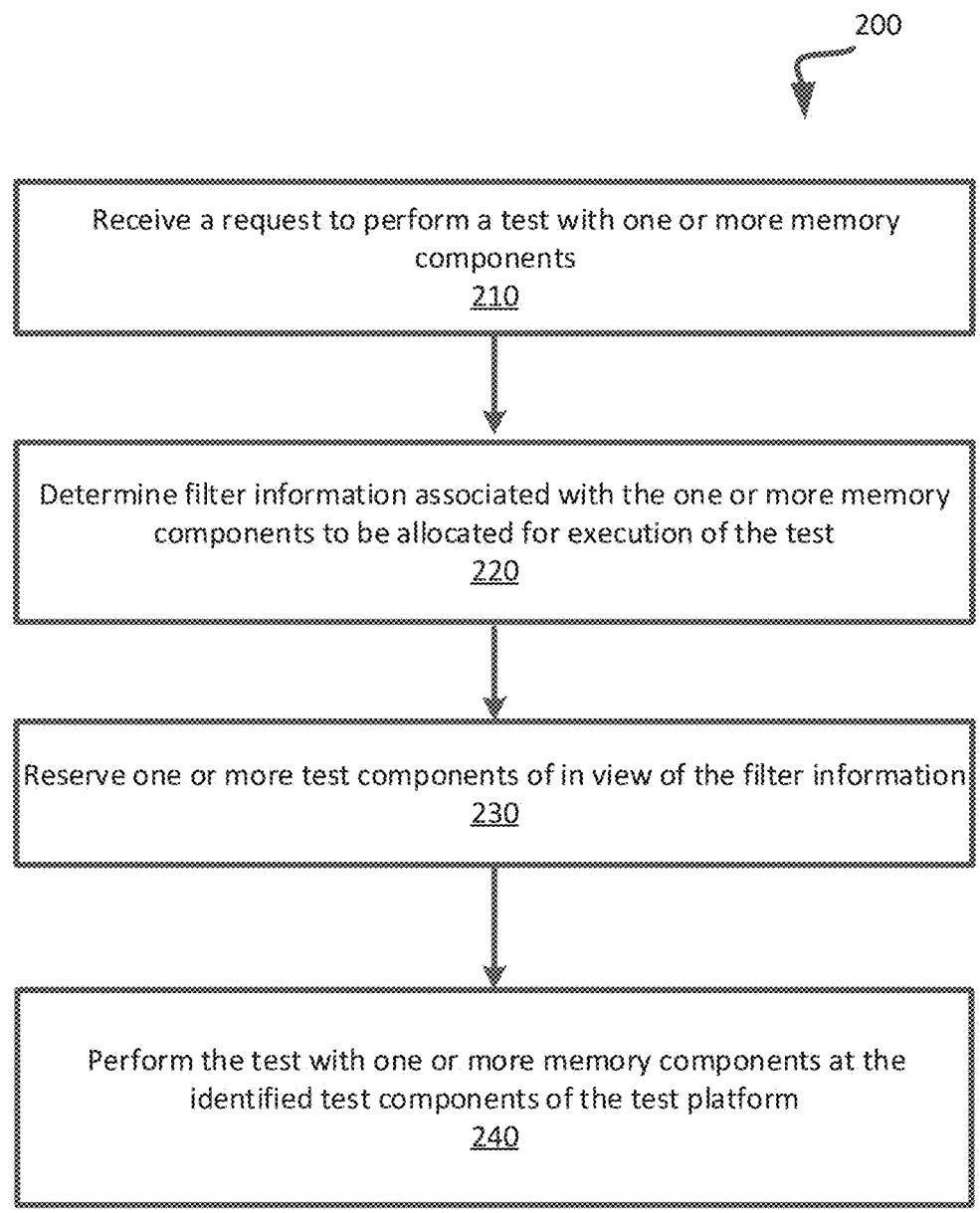
FIG. 2 is a flow diagram of an example method to allocate test resources to perform a test of memory components in accordance with some embodiments of the present disclosure.

FIG. 2 illustrates an example method 200 to allocate test resources to perform a test of memory components in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the resource allocator component 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown, at operation 210, the processing logic receives a request to perform a test of one or more memory components. For example, a user can provide a request to run a test of memory components by a test platform. The test can specify operations that are to be performed with the memory components. Such operations can include, but are not limited to, read operations, write operations, and erase operations. In some embodiments, the test specifies a sequence of multiple operations. As such, a user can provide information that specifies conditions at which a test of memory components is to be performed at a test platform.

The test can specify operating or test conditions at which the operations are to be performed at particular memory components. The test conditions can be a temperature condition of the memory component when the operations are performed at the memory component. In some embodiments, the test request can specify test conditions or can be used to identify test conditions that correspond to desired characteristics (e.g., component type) and usage (e.g., historical usage data) of the memory components that are to be allocated and used for the test, as described below.

At operation 220, the processing logic determines filter information (e.g., one or more elements of characteristics information and usage information) associated with memory components to be allocated for the test. In some embodiments, the test conditions can be used as the filter information to a filter and identify memory components having corresponding characteristics information and/or usage information. In some embodiments, each testing platform (e.g., rack of boards) can be associated with one or more databases configured to store characteristics information relating to the multiple associated test components (e.g., characteristics databases 416-1 and 416-N of FIG. 4).

In some embodiments, the usage information of the memory components can include, but are not limited to, a number of operations that have been performed by the memory components. For example, the test conditions can be used to identify desired usage information corresponding to memory components that have had more or less of a particular number of program-erase operations or cycles and a particular number of read operations. In some embodiments, the desired usage information can include the prior temperature conditions that have been applied to the memory component. For example, the usage information can include prior temperatures at which operations have been performed at the memory component for prior tests can be specified (i.e., a temperature profile of the memory component).

The test request can specify test conditions of the test or can be used to identify test conditions that correspond to desired filter information (e.g., test components that match the criteria associated with the identified characteristics information and usage information) of the memory components that are to be used in the test. In some embodiments, the available test sockets can be test sockets that are not being used by another test and that match the desired characteristics and/or usage information for memory components that are specified by the test. Thus, a first subset of test sockets (i.e., test resources) of the test platform can be available test sockets that match the conditions specified by the test and a second subset of test sockets can be test sockets that are not available and/or do not match the conditions specified by the test. Further details with respect to matching the desired characteristics are described in conjunction with FIG. 3.

At operation 230, the processing logic reserves one or more test sockets in view of the identified characteristics information and usage information associated with the test. In some embodiments, the processing logic determines available test sockets of one or more test platforms (e.g., racks). For example, test sockets at test boards of a test platform that are not currently being used to perform another test or operation and are not scheduled to be used to perform another test can be identified as available. For example, the test platform can include a number of test sockets and a subset of the test sockets can be currently used by another test of memory components while a second subset of the test sockets are not currently being used by another test of memory components. Thus, the second subset of the test sockets can be considered to be available test sockets. In some embodiments, the test can specify a period of time for which the test is to be completed. An available test socket in such a case can be a test socket that can be utilized for the test within the period of time. As such, if a particular test socket is currently being used by a test and will be scheduled to be free or available afterwards and the test can perform operations at the particular test socket within the specified period of time, then the particular test socket can be considered an available test socket.

The processing logic can identify a set of one or more test sockets that are available and match the characteristics information and usage information associated with the test. In some embodiments, the processing logic filters the available test resources (e.g., the available boards or available test sockets) in view of the characteristics information and usage information. For example, each rack at each location can maintain a local usage database (e.g., usage database 414-1 and 414-N of FIG. 4) and local characteristics database (e.g., characteristics database 416-1 and 416-N of FIG. 4) to store the usage and characteristics information about the respective test resources for use in filtering the available test resources in light of the test conditions associated with the test.

At operation 240, the processing logic configures and performs the test with one or more memory components at the available test sockets reserved based on the characteristics information and usage information of the one or more memory components. For example, the test can be performed at test sockets that are not currently being used by another test and that have characteristics that match the desired characteristics specified by the test. The test can be performed at different test sockets that are included in different test racks across the test platform. The performance of the test can apply different temperature conditions at different test sockets while different or the same sequences of operations are being performed at the test sockets. For example, a first socket can run a sequence of operations at a first temperature and a second test socket can run the same sequence of operations at a different second temperature. In some embodiments, the first test socket can run a first sequence of operations at a temperature and the second test socket can run a different second sequence of operations at the same temperature. In the same or alternative embodiments, the temperature condition applied to a particular test socket can vary during the performance of the sequence of operations.

In some embodiments, to configure the test for execution, the processing logic creates a list of one or more source code dependencies associated with the test. In some embodiments, the processing logic identifies one or more file locations associated with the source code dependencies (e.g., a corresponding folder or a uniform resource locator (URL) associated with a code repository). In some embodiments, the processing logic identifies one or more command lines (i.e., run properties) to be run in connection with the code associated with the test. In some embodiments, the processing logic can identify a relative folder location from which to run the one or more command lines. In some embodiments, the processing logic can identify a relative folder location where an output associated with the test (herein the "test results output") is generated.

According to some embodiments, the method 200 can be requested, initiated, and managed using a user interface communicatively coupled to the resource allocator 130 of FIG. 1. In some embodiments, a user can create the test request (e.g., a request in accordance with operation 210 of FIG. 2) by providing information to be used in accordance with the operations of FIG. 2.

Figure 3:
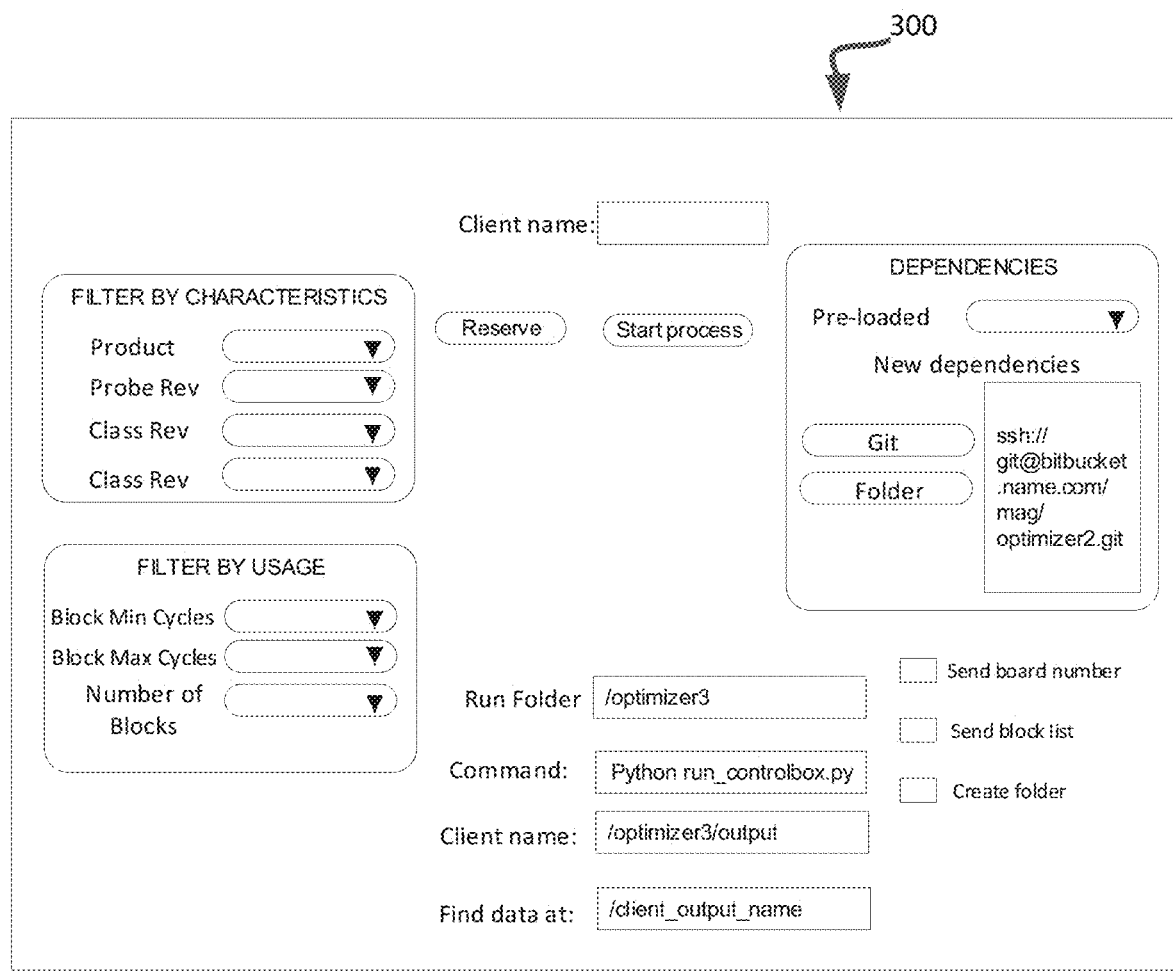
FIG. 3 illustrates an example interface associated with configuring a test of memory components in accordance with some embodiments of the present disclosure.

FIG. 3 illustrates an example interface 300 configured to collect various information from a user in connection with a test request. For example, after multiple memory component boards are identified and reserved in connection with the test, the interface 300 (e.g., a web-based interface such as web interface 422 of FIG. 4) allows for the test to be started by identifying a location of the source code (e.g., locally in a folder or in a code repository) and the command line to run it. In some embodiments, one or more additional parameters can be identified in connection with execution of the test, such as, for example, a relative location of the folder where the main function resides, a command line to run the main function, and a relative output folder location.

In some embodiments, the interface 300 can provide a filter for identifying characteristic information associated with desired test components, such as, for example, product type, probe revision, and class revision. The interface 300 can also provide a filter for identifying usage information associated with the desired test components, such as, for example, a minimum block cycle count, a maximum block cycle count, a number or range of desired blocks, etc.

In some embodiments, the interface 300 can also be employed to enable a user to configure and initiate a test by identifying a location of the source code and a command line to run it. As shown in FIG. 3, additional parameters associated with the test can be identified, such as, for example, a location of a folder where the main function resides (e.g., a run folder), a command line to run the main function, and a relative output folder location.

Figure 4:
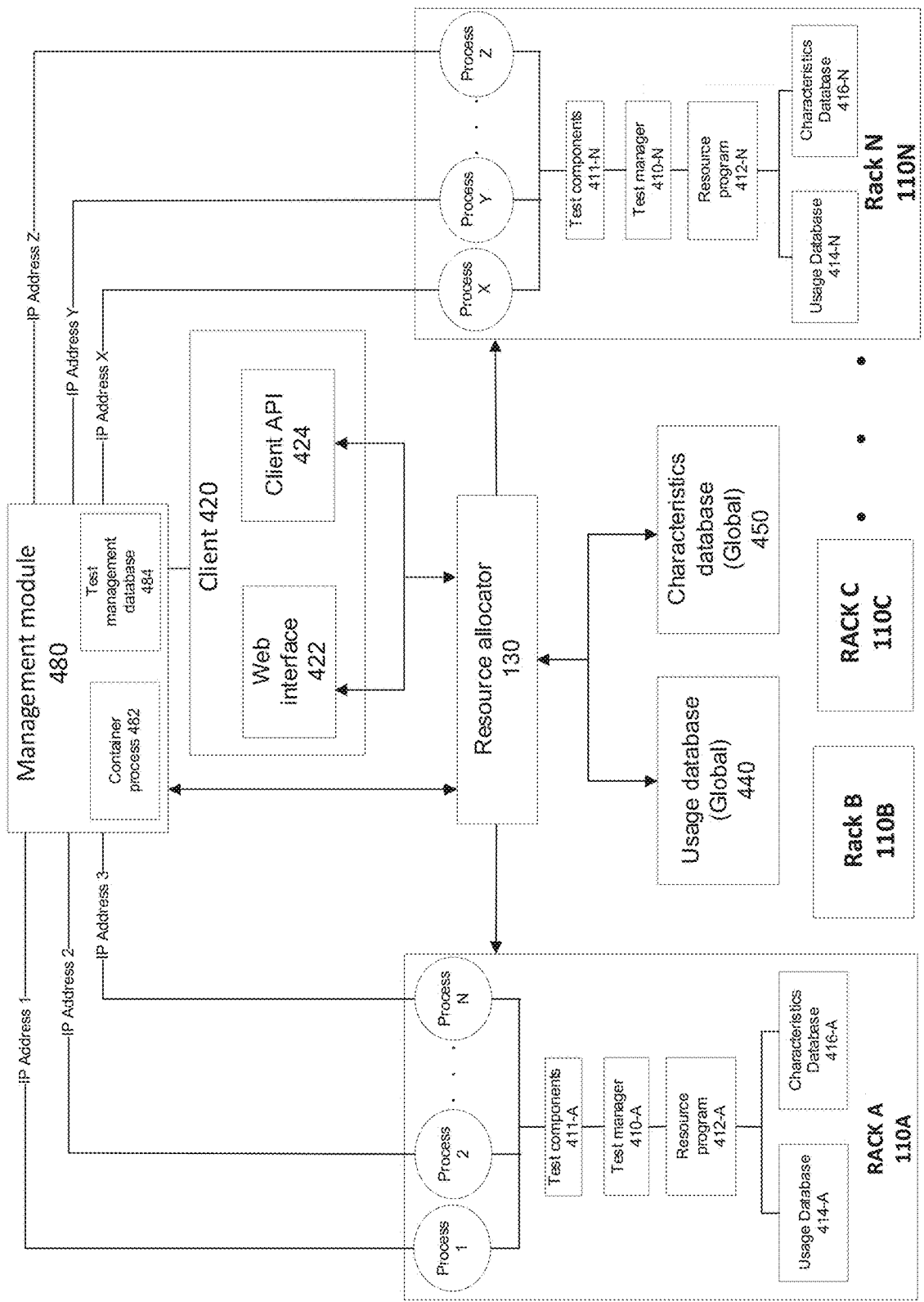
FIG. 4 illustrates an example testing platform to perform testing of memory components in accordance with some embodiments of the present disclosure.

In some embodiments, the interface 300 of a client device (e.g., client 420 of FIG. 4) communicates with a resource allocator (e.g., resource allocator 130 of FIG. 4) to copy the code to a workstation of one or more racks (e.g., Rack A 110A, Rack B 110B, Rack C 110C, and Rack N 110N of FIG. 4) for running the code (i.e., executing the test). In some embodiments, execution of the identified code for the test results in the performance of one or more test processes (e.g., process 1, process 2, process N, process X, process Y, and process Z of FIG. 4). As the test completes (e.g., either from a successful completion or a failure), the results are copied to a network drive from where the test results can be collected. In some embodiments, the test resources reserved and used in connection with the completed test can be released following completion of the test. In some embodiments, as the test result data is collected, the processing logic can store the data to a folder (e.g., the "/client_output_name" folder identified in the "Find data at:" field of interface 300 of FIG. 3) or other storage location accessible by the user.

In some embodiments, during the test process, the client device can be unaware of the locations of the physical test components (e.g., the physical boards, sockets, or memory components). In some embodiments, the code associated with the test runs on one or more geographically dispersed workstations (e.g., Linux workstations) associated with the boards including the reserved test components. In some embodiments, the resource allocator can optimize the selection of locations of the test components to manage (e.g., reduce) data transfer time performance.

FIG. 4 illustrates an example environment including a management module 480 communicatively connected to client 420 requesting performance of a test, according to embodiments of present disclosure. In some embodiments, the management module 480 coordinates with a resource allocator 130 to perform a test using test components (e.g., test components 411-A and 411-N) physically located in one or more geographically dispersed component racks (e.g., Rack A 110A, Rack B 110B, Rack C, 110C). As described above with respect to method 200, a client 420 can submit a test request to the resource allocator 130 via a web interface 422 of client 420. The resource allocator 130 identifies and reserves test components for execution of the test processes. In some embodiments, the reserved test components 411 can be located in geographically dispersed racks 110. For example, the requested test can include the performance of a set of test processes including Process 1, Process 2 . . . Process N and Process X, Process Y . . . and Process Z. In the example shown in FIG. 4, the resource allocator 130 can identify test components 411-A of Rack A 110A for execution of Process 1, Process 2 . . . Process N. Furthermore, the resource allocator 130 can identify test components 411-N of Rack N 110N for execution of Process X, Process Y . . . Process Z. In this example, Rack A 110A and Rack N 110N are in different geographic locations. In some embodiments, the resource allocator 130 can analyze usage information stored in a usage database 440 and characteristics information stored in a communicatively connected characteristics database 450 to identify the one or more test components satisfying test conditions associated with the requested test. In some embodiments, In some embodiments, the resource allocator 130 communicates with a resource program (e.g., resource program 412-A, 412-N), such as a daemon program, to communicate information (e.g., identifying source code, command lines, etc.) associated with the requested test. As shown in FIG. 4, each resource program of each rack workstation can be associated with a usage database (e.g., usage database 414-A, 414-N) and a characteristics database (e.g., characteristics database 416-A, 416-N) for storing usage and characteristic information associated with the test components 411-A, 411-N of the local rack. For example, usage database 414-A stores the usage information associated with test components 411-A of Rack A 110A and characteristics database 416-A stores the characteristics information associated with test components 411-A of Rack A 110A.

The test information (e.g., the test instructions) received by the resource program 412-A, 412-N are provided to a local test manager 410-A, 410-N to facilitate the execution of the one or more test processes (e.g., Process 1, Process 2 . . . Process N for Rack A 110A) by the identified and reserved test components 411A, 411N. In an embodiment, the test components 411 can include one or more sockets including one or more memory components, as shown in FIG. 1. For example, the resource allocator 130 can execute operations in accordance with method 200 of FIG. 2 to coordinate the performance of a test using the various multiple test components 411A, 411N of the multiple geographically dispersed racks 110A, 110B, 110C . . . 110N.

In some embodiments, the management module 480 is communicatively connected to the client 420 and configured to execute a container process 482 to manage performance of one or more test processes by multiple racks (also referred to as a rack cluster). The management module 480 can be employed to enable feedback communications from each of the individual test processes (e.g. Process 1, Process 2 . . . Process N, Process X, Process Y . . . Process Z). In some embodiments, execution of the container process 482 enables communication between the management module 480 and the client 420 via a client API (e.g., a Python API) to coordinate the reservation of test components by the resource allocator 130 based on filters (e.g., usage and characteristics filters), as described in detail below with reference to FIG. 5. In some embodiments, the management module 480 establishes the feedback communication link with the individual test processes by providing each of the test processes with unique connection information (e.g., IP Address 1, IP Address 2, IP Address 3, IP Address X, IP Address Y, and IP Address Z). In some embodiments, the unique connection information (e.g. a unique IP address or other such network identification information) is provided to each of the individual processes to allow each individual process to communicate directly with the management module 480. For example, a first test process (e.g., Process 1 executing on Rack A 110A) can receive the connection information assigned by the master module 480 and establish a connection to provide feedback information to the master module 480. For example, the feedback information can include results of the corresponding test process, conditions associated with the test (e.g., temperature conditions, characteristics information, usage information, etc.), and a listing of the one or more events or operations performed by the test process (e.g., events or operations that were performed prior to and/or including a failure associated with the operation of the memory component (e.g., an actual operational error or an anomaly caused by noise or some other factor), or failure associated with the test process (e.g., a part or portion of the test process failed indicating a performance issue). In some embodiments, the management module 480 can collect feedback information from multiple different processes via respective unique connections and store the feedback information in a test management database 484.

Figure 5:
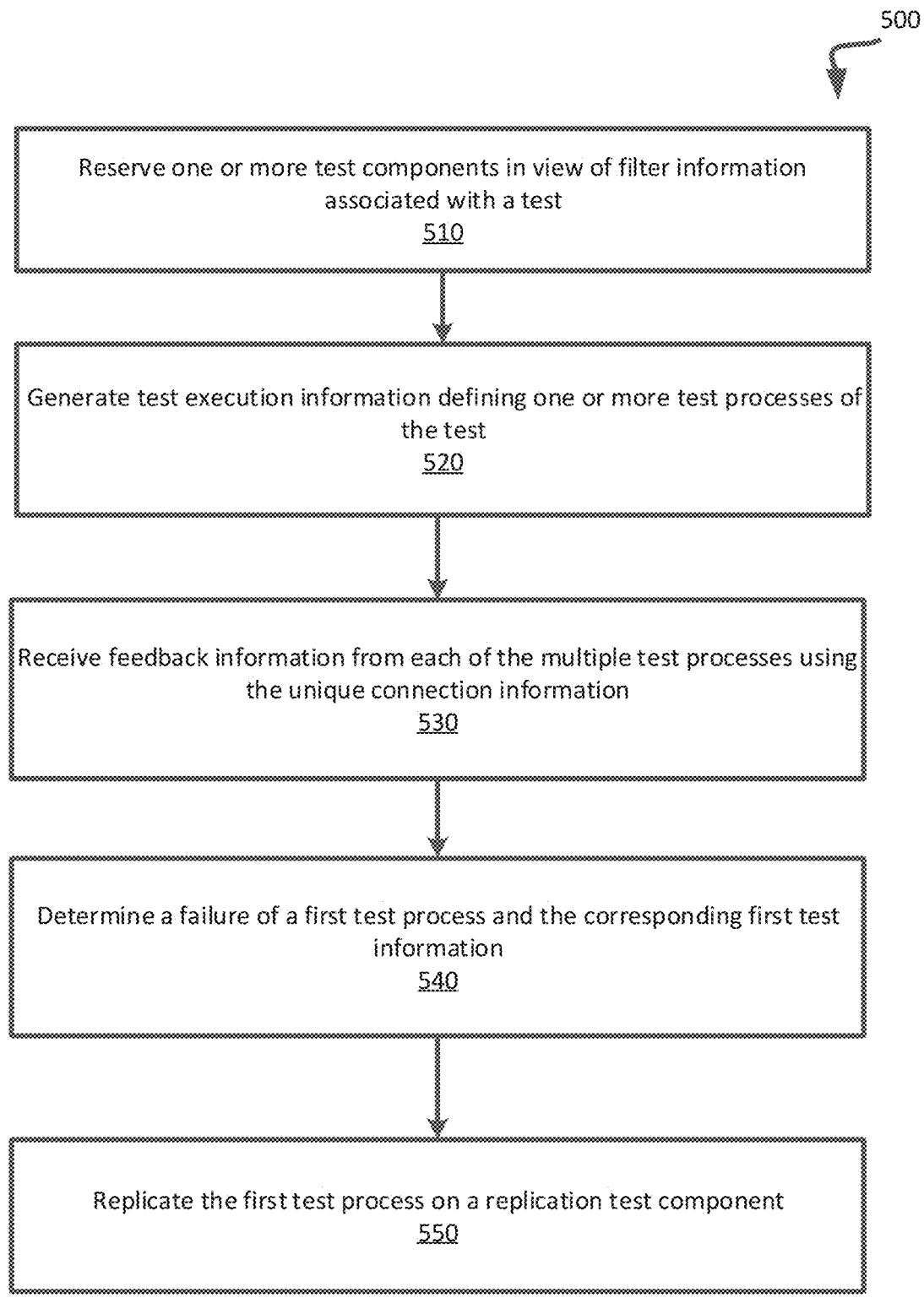
FIG. 5 is a flow diagram of an example method to replicate failed testing of memory components in accordance with some embodiments.

FIG. 5 is a flow diagram of an example method 500 (also referred to as a "container process") to collect feedback information from multiple test processes executing a test associated with multiple distributed test components (e.g., test sockets including one or more memory components) and replicate a failed test process to identify a failure as either an error (e.g., an operational error associated with one or more memory components) or an anomaly (e.g., a failure that is due to noise). In some embodiments, having identified a failure with respect to a test process associated with one or more memory components (i.e., first memory components), the processing logic may replicate the failed test process on one or more different memory components (also referred to as "replication components"). In some embodiments, the processing logic re-creates the conditions of the test process that failed using the feedback information received from the failed test process. In some embodiments, in the event the replication of the test process produces a failure with respect to the one or more replication components (i.e., memory components having the same characteristic and usage information of the first memory component(s)), the processing logic identifies the failure associated with the first memory components as an actual error (e.g., a verified or confirmed error relating to the operation of a memory component). In the event the replication of the failed test process produces successful results (i.e., no failure is detected), the processing logic identifies the failure associated with the first memory components as an anomaly (e.g., due to noise). The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed at least in part by the management module 480 of FIG. 4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown, at operation 510, the processing logic of the management module 480 (e.g., the processing logic of the container process 482) reserves one or more test components in view of filter information associated with a test. In some embodiments, the management module 480 communicates with a resource allocator 130 of FIG. 4 via an API (e.g., client API 424 of client 420) to identify the test and corresponding filter information (e.g., characteristics information and usage information). (e.g., resource allocator receives an indication to perform a test with memory components.

At operation 520, the processing logic generates test execution information defining one or more test processes of the test. In some embodiments, the test execution information includes, but is not limited to, a list of code dependencies associated with the test, the run properties for each board corresponding to each of the reserved test components, and unique connection information (e.g., a unique IP address) for each of the individual test processes associated with the test. In an example, the connection information can be provided by the management module as a run type input in a corresponding command line. In some embodiments, the management module communicates the text execution information including a list of each reserved hostname (e.g., rack workstation) and the command line for each host to the client (e.g., client 420 of FIG. 4). The client can then use the test execution information to trigger or initiate the one or more test processes on the reserved boards and corresponding test components.

At operation 530, the processing logic receives feedback information from each of the multiple test processes via the corresponding connection established using the connection information provided for each of the test processes. For example, the feedback information may include a number of program and erase cycles a failing memory component has received, a temperature at a time when a failure of the memory component occurred, one or more temperatures when data was written on the memory component, a state of a memory component (e.g., suspended), a time from a last memory operation, a state of a memory block (e.g., partially or fully programmed), etc.

In some embodiments, the feedback information and can include information associated with the corresponding test process, such as, information identifying a failure (e.g., an anomaly or error) associated with the test process executed on one or more memory components, a listing of the one or more events occurring in connection with a test process failure, associated characteristic information and usage information of the one or more memory components, and a set of conditions associated with the execution of the test process. Example conditions associated with testing can include temperature conditions of the one or more memory components being tested, the temperature as a function of time (e.g., the temperature at every second of the testing), Vcc values, identification of instances of suspension and resumption, etc. The management module can collect and aggregate the feedback information received from the multiple test processes and store the collected feedback information in one or more databases (e.g., test management database 484 of FIG. 4). In some embodiments, the test process can identified the occurrence of an error and generate a list of events that caused or led up to the error. The test process can set a flag to indicate the error and store the flag and the list of events in a file that is provided in the form of the feedback information via the unique IP address to the management module.

At operation 540, the processing logic determines a failure of a first test process and the corresponding first test information. In some embodiments, in view of the feedback information, the processing logic determines a failure of a test process and information associated with the test process (e.g., the test information). For example, the management module can review first feedback information received from Process 1 executed on test components 411-A of Rack A 110-A of FIG. 4. The management module can determine that Process 1 failed during execution. The management module can further identify the feedback information including first test information associated with Process 1 received via IP Address 1. In some embodiments, the first test information can include one or more of an identification of the command line information associated with Process 1, the associated characteristic information, the associated usage information, a listing of the one or more events or operations executed in connection with Process 1, a set of one or more conditions associated with the execution of Process 1, and any other information associated the execution of Process 1.

At operation 550, the management module can replicate execution of the first process on one or more replication test components. The replication test component can be a selected test component that matches a test component used during the failed test process. For example, the replication test component can have characteristic and usage information that matches the test component of the failed test process. The management module can replicate the first test process using the same or substantially similar test conditions as used during the identified failed execution of the test process. In this regard, the management module can replicate all of the variables (e.g., test conditions, test parameters, component parameters, etc.) to execute the failed test process in a controlled and monitored environment to identify a cause or source of the failure. In some embodiments, the replication test component can be located on a different board of the same rack or a different rack that is in a different location. In some embodiments, the management module can employ one or more boards that are dedicated to serve as the replication test components. The set of events identified in the feedback information can be used for replication of the error using the dedicated replication testing boards.

Advantageously, failures associated with one or more of the distributed test processes can be identified using the feedback information returned by the respective test processes via the direct connection established with the management module. The management module can replicate or recreate the particular test conditions associated with the failed test process to determine if the failed test process was an anomaly (e.g., due to noise) or an error requiring a remedy. In some embodiments, in the event the replication of the failed test process produces a failure with respect to the one or more replication component, the processing logic can identify the failure associated with the first memory component (e.g., the one or more memory components involved in the first failed test process) as an actual error associated with the memory component. In the event the replication of the failed test process produces successful results (i.e., no failure is detected), the processing logic identifies the failure associated with the first memory components as an anomaly (e.g., the initial failure is due to noise), and not an error or malfunction of the first memory component. In some embodiments, the management module can identify the failed process is due to an error and can identify a source or reason for the error. In some embodiments, the management module can coordinate the release of the testing components upon completion of the testing.

As noted above, conventional quality and reliability testing of memory components is limited to testing a limited number of usage parameters (e.g., intrinsic charge loss (ICL), read disturb loss, program disturb loss, etc.) at a single chamber under a single set of conditions (e.g., temperature conditions). As detailed above, aspects of the present disclosure address these deficiencies by employing a distributed test platform configured to allocate multiple test components to perform tests and collect feedback information covering a wider set of conditions in usage space associated with a memory component, thereby reducing gaps in conventional qualifications testing.

In some embodiments, the testing platform of the present disclosure can execute tests of the usage space associated with memory components including test operations (e.g., erase, program, and read operations) to generate multiple different test samples using multiple different testing dimensions of the usage parameters.

The testing methodology provides for multi-dimensional usage space testing to cause forcing normally low probability events to occur at a higher frequency. The testing methodology applies analysis techniques to handle a vast amount of testing data. Advantageously, the test platform generates a diverse set of usage conditions for testing a memory component.

In some embodiments, the test platform identifies and extracts failures that can occur in the memory components that are observable during a write or a read operation. For example, a write failure can be identified as a failed status or abnormal deviation in program time. In another example, a read failure can be identified as a margin loss, an unexpectedly high error rate, or as unrecoverable data. The test platform can further identify a boundary or limit of the usage space where the memory component remains operational. For example, the test platform can determine whether the memory component is operational at a multi-dimensional usage space, such as, at the following combination of usage conditions: at half the total cycles, at full cross temperature and at half the maximum allowed reads. It is noted that any suitable combination of conditions of the usage space can be combined to generate a multi-dimensional space (e.g., a set of usage conditions) for testing the memory component. In some embodiments, the test platform can develop a model to predict an optimal media management recovery flow for a given set of usage conditions.

In some embodiments, the testing system utilizes multiple different sockets to be used in the multiple different tests of the usage space of the associated memory components. As described in detail with respect to FIGS. 1-5, the testing system employs connections to the multiple test processes of the multiple tests to collect test results, identify failures, and determine the occurrence of errors. In an embodiment, dimensions of a usage space associated with a memory component can be identified and classified as vectors, path variables, or a media management property. In an embodiment, a vector can represent a property that describes an end state or a constant usage for a sample, such as, for example, a total writes during a life of a memory component, a retention bake at an end of life of a memory component, etc. In some embodiments, usage parameters that can be defined as path variables include properties or conditions that continuously change during the operation of the memory component. In an embodiment, a path variable can be a property that changes during a life of a memory component. In an embodiment, a media management property can be a property that represents or describes how data is read or recovered from a test sample (e.g., default read, read entry, auto read cal, soft read, cRLC, etc.)

In some embodiments, the multiple different tests are associated with a common goal or target vector associated with a usage parameter (e.g., a number of writes) of a memory component. For example, 100 memory components can be tested to generate test samples in view of the defined goal (or target vector) of performing 10,000 write operations (i.e., the usage parameter). The steps and conditions (i.e., path variables) associated with each of the test samples used to reach the 10,000 write operations can be different. In some embodiments, the different testing conditions (i.e., set of path variables) are applied for each of the respective tests to generate a distributed sampling of the test samples corresponding to the target vector.

Figure 6:
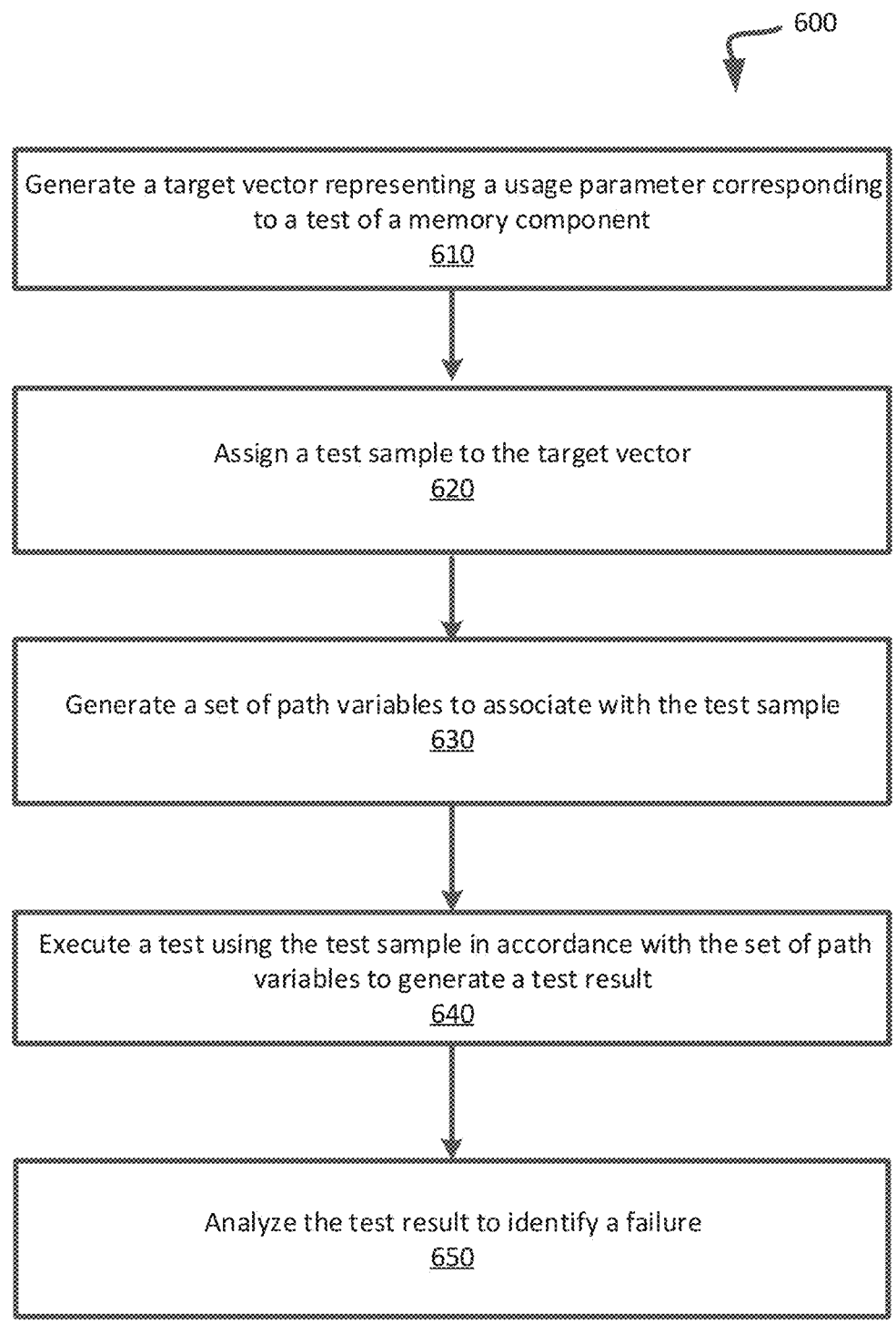
FIG. 6 is a flow diagram of an example method to expand test samples in a usage space associated with memory component testing.

FIG. 6 is a flow diagram of an example method 600 (also referred to as a "container process") to expand test samples in a usage space associated with memory component testing and reduce testing gaps. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed at least in part by the management module 480 of FIG. 4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In operation 610, the processing logic generates a target vector (e.g., a vector representation) for a usage parameter corresponding to a test of a memory component. In some embodiments, one or more first usage parameters of the usage space of the memory component can be established as the target vector. In some embodiments, the target vector represents an end goal or result that the test is configured to test for or reach. For example, the test may be configured to have 100 memory components perform 10,000 write operations. In this example, the target vector represents the end point for each memory component used in the test.

Example usage parameters that can be represented as the target vector include a count of writes, a count of reads, a block type, a partial program rate, an interrupt type, a time between writes, a time between reads, a block erase type, a read page fraction, an interrupt rate, a time between writes and reads, a block type rate, and an interrupt time. In some embodiments, the target vector is defined as a property that describes the end state or a constant usage for a test sample.

In operation 620, the processing logic assigns a test sample to the target vector. In some embodiments, a test sample refers to one or more memory blocks of a memory component that experience a same set of test conditions during their lifetime. In some embodiments, the processing logic assigned each test sample of a set of multiple test samples to the target vector. In some embodiments, the resource allocator 130 of FIG. 1 and FIG. 4 can coordinate the assignment or allocation of the test samples to the various memory components with the corresponding target vector information.

In operation 630, the processing logic generates a set of path variables to associate with the test sample. In some embodiments, the set of path variables is randomly selected by the processing logic, such that each test sample follows a randomized path to the target vector. In some embodiments, one or usage parameters of the usage space are selected as the path variables. In an embodiment, the path variables can be a property that continuously changes during a life of a memory component. In an embodiment, test samples assigned to the target vector follow a random path of path variables to the target vector with reads using media management techniques. Example usage parameters that can be selected as path variables include a temperature of writes, the Vcc of a write, the Vcc noise, a temperature of reads, a temperature of writes, the Vcc of a read, and a concurrency of write and read operations.

Figure 7A:
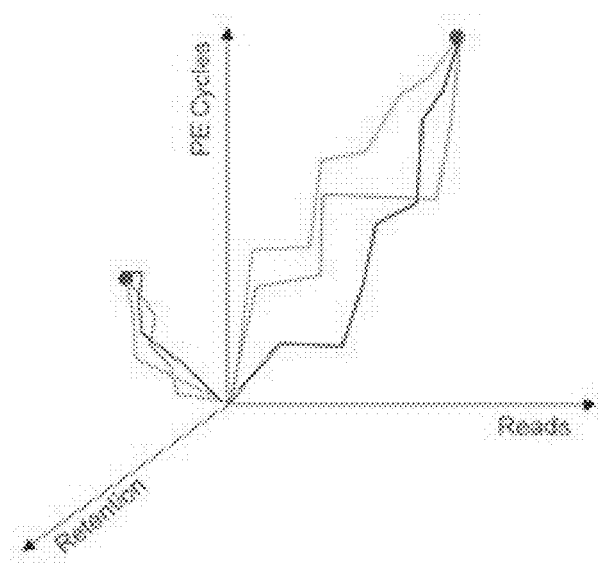
FIGS. 7A-7C are example representations generated in the execution of multi-dimensional usage space testing of memory components in accordance with some embodiments.

In some embodiments, each test sample (e.g., group of memory component blocks) is assigned an individual target vector and follows a random path (e.g., a set of randomly selected path variables) to the target vector. In some embodiments, the processing logic establishes multiple test samples corresponding to the usage space of the memory component to identify performance results at a multi-dimensional level of the usage space associated with memory components. FIG. 7A illustrates an example of two three-dimensional target vectors (e.g., representing usage parameters of retention, program-erase (P/E) cycles, and reads) and three associated random paths leading to the respective target vectors. For example, a target vector can specify a usage parameter of 10,000 write operations to be performed at each memory component that is assigned to a test. Each memory component can perform the 10,000 write operations corresponding to the usage parameter, but the path or performance of additional operations based on the path variables can be different for each of the memory components used in the test. For example, a first memory component can perform 10,000 write operations with intermediate read operations being performed after every 100 write operations. A second memory component can perform 10,000 write operations, but with intermediate erase operations being performed after every 120 write operations. Thus, each memory component that is used in the test can perform the same 10,000 write operations, but the intermediate operations or other such parameters during the performance of the 10,000 write operations can be different. For example, each memory component can perform 10,000 write operations, but under different temperature conditions that are varied at different rates and times.

Figure 7B:
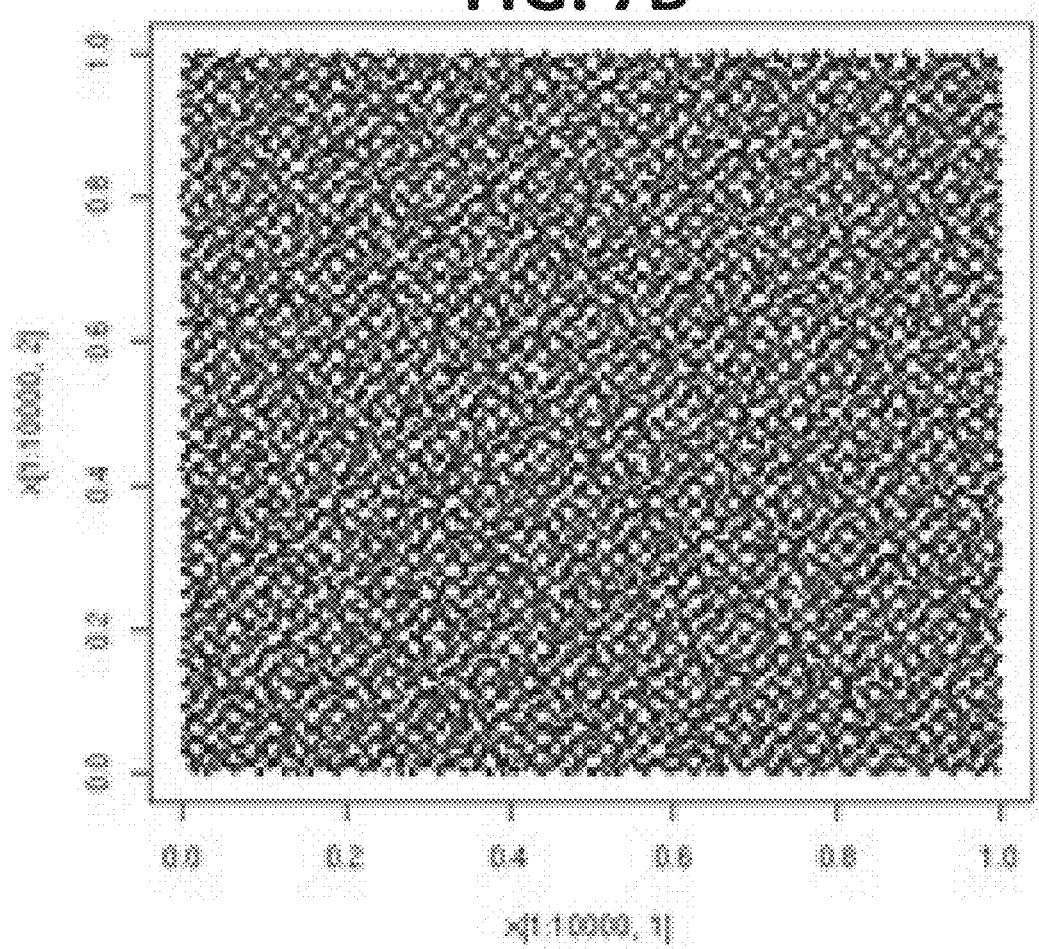
Figure 7C:
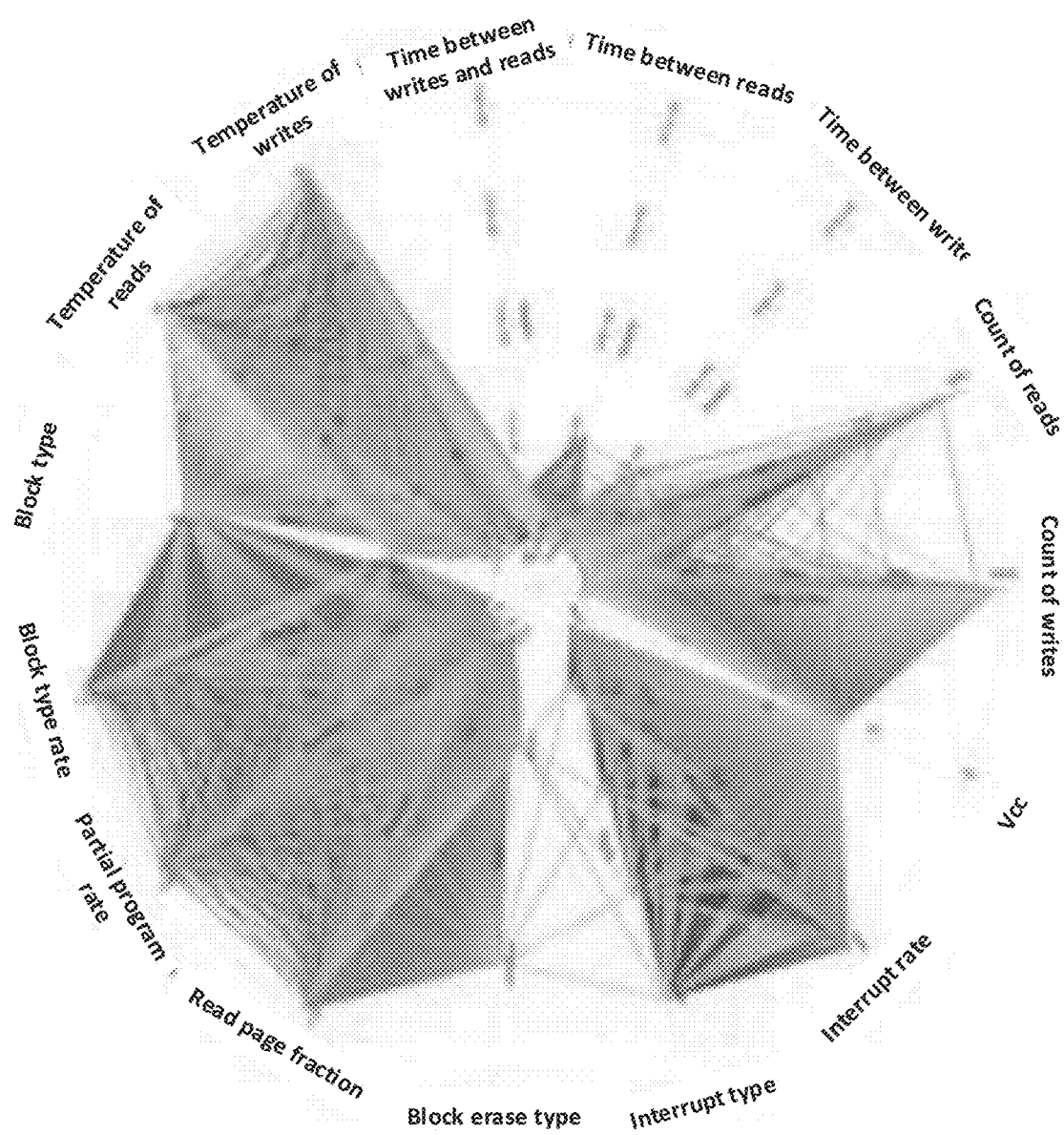

In some embodiments, the processing logic generates multiple test sample points corresponding to the usage space by generating multiple sets of path variables to associate with multiple different test samples. FIG. 7B illustrates an example generation of 10,000 test sample points of a two-dimensional sequence. In some embodiments, the test sample points are generated using a sequencing method methodology (e.g., a low discrepancy method such as a Sobol sequencing method, etc.). In some embodiments, a set of target vector samples are generated based on the test sample points. FIG. 7C illustrates a set of 1,000 samples of target vectors including vector type labels generated by the processing logic of the present disclosure. In some embodiments, the target vector samples are generated using a low discrepancy sequence, such as a Sobol sequencing method.

In block 640, the processing logic executes a test using the test sample in accordance with the set of path variables to generate a test result. In some embodiments, the set of path variables includes one or more randomized path variables. In some embodiments, having established the target vector and set of path variables corresponding to the test sample, the processing logic can identify and reserve a memory component to be tested. In some embodiments, the processing logic (e.g., processing logic of resource allocator 130 of FIGS. 1 and 4) identifies and reserves a test resource corresponding to the set of path variables (e.g., a test socket including memory components matching the usage parameters of the set of path variables) for use as the test sample.

In operation 650, the processing logic analyzes the test result (e.g., a first test result associated with a first test sample and other test results corresponding to respective test samples) to identify a failure. In some embodiments, one or more failures associated with the one or more test samples can be identified. In some embodiments, the dimensional data from the randomized testing is stored in a file and parsed into smaller representations (e.g., tables). In an embodiment, failure detection and associated determinations whether the failure is a true error or an anomaly (e.g., due to noise) can be performed by the processing logic as described above in connection with FIGS. 4 and 5. In some embodiments, the test results associated with each test sample are provided to a management module (e.g., management module 480 of FIG. 4) as feedback information via a connection between the corresponding test processes and the management module.

In an example, one or more functional failures associated with erase, program and read operations are made visible and constitute a 'strike' against a test block involved in the testing process. In an example, a read raw bit error rate (RBER) threshold can be applied to trigger an error handling process flow configured to recover the read operation (e.g., by selecting various trims (e.g., a command that enables an operating system to inform a memory component (e.g., a NAND flash solid-state drive (SSD)) which data blocks it can erase because they are no longer in use)), adaptive replacement cache (ARC), a Vt sweep for segmentation of a failure due to an error relating to the memory component (e.g., a 'strike'). In some embodiments, after reaching a threshold number of strikes (e.g., after three strikes), a block can be retired or removed from testing. In some embodiments, anomalies can also be classified in the analysis (e.g., analysis of RBER, typical page programming time (tProg), tErase responses, etc.) as statistical outliers, erratic manifestation or other pathological behavior. In some embodiments, anomaly detection analysis can be performed in connection with the above-described parsing and/or during post-processing of the output tables.

Figure 8:
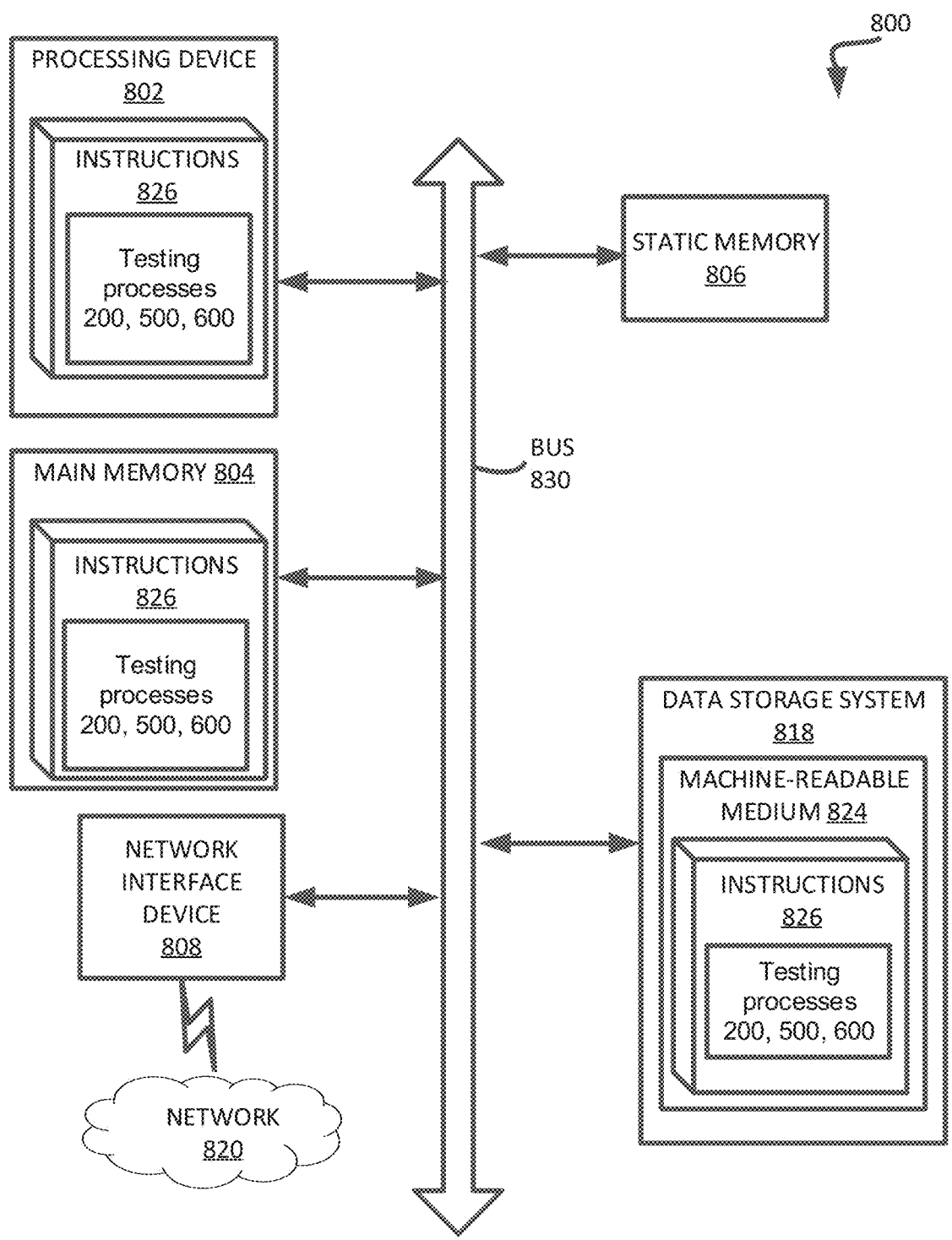
FIG. 8 is a block diagram of an example computer system in which implementations of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host or server system that includes, is coupled to, or utilizes a test platform including one or more of the resource allocator 130 of FIG. 4 and a management module 480 of FIG. 4 (e.g., to execute operations corresponding to the testing processes 200, 500, 600 of FIGS. 2, 5 and 6). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to a memory sub-system.

In one embodiment, the instructions 826 include instructions to implement functionality corresponding to testing processes described herein (e.g., processes 200, 500, and 600 of FIGS. 2, 5, and 6), the resource allocator 130 of FIG. 4, and the management module 480 of FIG. 4. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   determining, by a processing device, filter information associated with a test to be performed on one or more memory components, wherein the filter information comprises at least one of characteristics information or usage information associated with at least a portion of the one or more memory components;
   selecting a first test component comprising a first set of memory components of the one or more memory components and a second test component comprising a second set of memory components of the one or more memory components in view of the filter information;

generating test execution information defining a set of test processes of the test;

distributing a first portion of the test execution information corresponding to a first test process to the first test component comprising the first set of memory components;

distributing a second portion of the test execution information corresponding to a second test process to the second test component comprising the second set of memory components, wherein the second test is different from the first test;

receiving, via a first connection with the first test process of the set of test processes, first feedback information; and determining, based on the first feedback information, a failure of the first test process.

2. The method of claim 1, further comprising:

receiving, via a second connection with the second test process of the set of test processes, second feedback information; and determining, based on the second feedback information, a successful execution of the second test.

3. The method of claim 1, further comprising replicating, using the first feedback information, the first test process on a replication test component.

4. The method of claim 3, further comprising determining the failure represents an error associated with a memory component of the first set of memory components in view of the replicating of the first test process generating the failure.

5. The method of claim 3, further comprising determining the failure represents an anomaly associated with a memory component of the first set of memory components in view of the replicating of the first test process generating a successful result.

6. The method of claim 1, further comprising providing unique connection information to the first test process to establish the first connection to transmit the first feedback information.

7. A system comprising:

a set of memory components; and a processing device, operatively coupled with the set of memory components, to:

receive a request to perform a test of the set of memory components;

determine filter information corresponding to one or more conditions of the test;

reserve a first test component comprising a first portion of the set of memory components comprising at least one of first characteristics information or first usage information matching the filter information;

reserve a second test component comprising a second portion of the set of memory components comprising at least one of second characteristics information or second usage information matching the filter information;

perform a first sequence of operations of the test using the first portion of the set of memory components;

perform a second sequence of operations of the test using the second portion of the set of memory components, wherein the first sequence is different than the second sequence;

receive, via a connection with a first test process of the test, feedback information indicating a first failed test result; and replicate the first test process on a replication test component using the feedback information.

8. The system of claim 7, wherein the first test component is located at a first location and a second test component is located at a second location.

9. The system of claim 7, wherein the first test component comprises an available test socket comprising the first portion of the set of memory components to be tested.

10. The system of claim 7, the processing device is further to:

generate test execution information defining the first sequence of operations and the second sequence of operations of the test.

11. The system of claim 10, the processing device is further to:

receive additional feedback information indicating successful execution of the second sequence of operations.

12. The system of claim 11, wherein the first portion of the test execution information comprises connection information assigned to the first test process.

13. The system of claim 12, the processing device is further to:

determine the first failed result represents an error associated with a memory component of the first portion of the set of memory components in view of the first test process replicated on the replication component generating a second failed test result.

14. The system of claim 13, the processing device is further to:

determine the first failed result represents an anomaly associated with a memory component of the first portion of the set of memory in view of the first test process replicated on the replication component generating a successful test result.

15. A non-transitory computer readable medium comprising instructions, which when executed by a processing device, cause the processing device to perform operations comprising:

determining filter information associated with a test to be performed on one or more memory components, wherein the filter information comprises at least one of characteristics information or usage information associated with at least a portion of the one or more memory components;

selecting a first test component comprising a first set of memory components of the one or more memory components and a second test component comprising a second set of memory components of the one or more memory components in view of the filter information;

distributing a first portion of test execution information corresponding to a first test process to the first test component comprising the first set of memory components;

distributing a second portion of the test execution information corresponding to a second test process to the second test component comprising the second set of memory components, wherein the second test is different from the first test;

receiving, via a first connection with the first test process of the set of test processes, first feedback information;

determining, based on the first feedback information, a first failed test result of the first test process; and replicating, using the first feedback information, the first test process on a first replication test component.

16. The non-transitory computer readable medium of claim 15, wherein replicating the first test process on the first replication test component generates a second failed test result.

17. The non-transitory computer readable medium of claim 16, the operations further comprising:

determining the first failed result represents an error associated with a memory component of the first set of memory components in view of the second failed test result.

18. The non-transitory computer readable medium of claim 15, wherein replicating the first test process on the first replication test component generates a successful test result.

19. The non-transitory computer readable medium of claim 18, the operations further comprising:

determining the first failed result represents an anomaly associated with a memory component of the set of memory components in view of the successful test result.

20. The non-transitory computer readable medium of claim 15, wherein each test process of the set of test processes is assigned a unique IP address to use in establishing a connection to provide feedback information associated with a respective test process.

\* \* \* \* \*